(12) United States Patent
Black et al.

(10) Patent No.: US 6,585,567 B1
(45) Date of Patent: Jul. 1, 2003

(54) SHORT CMP POLISH METHOD

(75) Inventors: Andrew J. Black, San Antonio, TX (US); Allison Deen, San Antonio, TX (US)

(73) Assignee: Koninklijke Philips Electronics N.V., Eindhoven (NL)

(*) Notice: Subject to any disclaimer, the term of this patent is extended or adjusted under 35 U.S.C. 154(b) by 142 days.

(21) Appl. No.: 09/943,719

(22) Filed: Aug. 31, 2001

(51) Int. Cl.$^7$ ................................................ B24B 1/00
(52) U.S. Cl. ............................. 451/36; 451/53; 451/57; 451/59
(58) Field of Search ............................... 451/36, 41, 57, 451/59, 63; 483/692, 693; 216/88, 89

(56) References Cited

U.S. PATENT DOCUMENTS

| | | |
|---|---|---|
| 4,680,893 A | 7/1987 | Cronkhite |
| 5,597,443 A | 1/1997 | Hempel |
| 5,607,718 A | 3/1997 | Sasaki et al. |
| 5,643,406 A | 7/1997 | Shimomura et al. |
| 5,704,987 A | 1/1998 | Huynh et al. |
| 5,772,780 A | 6/1998 | Homma et al. |
| 5,816,891 A * | 10/1998 | Woo ............................. 451/36 |
| 5,851,899 A | 12/1998 | Weigand |
| 5,893,756 A | 4/1999 | Berman et al. |
| 5,895,550 A | 4/1999 | Andreas |
| 5,899,738 A | 5/1999 | Wu et al. |
| 5,922,136 A | 7/1999 | Huang |
| 5,922,620 A | 7/1999 | Shimomura et al. |
| 5,935,869 A | 8/1999 | Huynh et al. |
| 5,989,105 A | 11/1999 | Kawakawaguchi et al. |
| 6,077,785 A | 6/2000 | Andreas |
| 6,080,673 A | 6/2000 | Ko et al. |
| 6,098,638 A | 8/2000 | Miyashita et al. |
| 6,099,662 A | 8/2000 | Wang et al. |
| 6,103,569 A | 8/2000 | Teo et al. |
| 6,130,163 A | 10/2000 | Yi et al. |
| 6,152,148 A | 11/2000 | George et al. |
| 6,159,076 A | 12/2000 | Sun et al. |
| 6,171,514 B1 | 1/2001 | Hara et al. |
| 6,180,497 B1 | 1/2001 | Sata et al. |
| 6,190,237 B1 | 2/2001 | Huynh et al. |
| 6,191,086 B1 | 2/2001 | Leon |
| 6,197,691 B1 | 3/2001 | Lee |
| 6,200,899 B1 | 3/2001 | Fournier |
| 6,204,169 B1 | 3/2001 | Bajaj et al. |
| 6,214,745 B1 | 4/2001 | Yang et al. |
| 6,220,934 B1 | 4/2001 | Sharples et al. |
| 6,228,771 B1 | 5/2001 | Allers |
| 6,232,241 B1 | 5/2001 | Yu et al. |
| 6,252,709 B1 | 6/2001 | Sato |
| 6,322,425 B1 * | 11/2001 | Darcangelo et al. .......... 451/41 |

* cited by examiner

*Primary Examiner*—Timothy V. Eley
*Assistant Examiner*—Alvin J Grant
(74) *Attorney, Agent, or Firm*—Peter Zawilski

(57) ABSTRACT

A short CMP polish process is provided which removes minimal amounts of oxide and reduces defectivity at the surface of the wafer during short periods of rework by maintaining a high pH at the wafer surface in the presence of a high pH slurry. In one embodiment of the present inventions, the first platen of a multi-platen CMP machine is skipped for polishes of a short duration. In a second embodiment, a large amount of slurry is used to prime the second polish platen, thus displacing deionized water at the surface of the wafer which would ordinarily lower the initial pH of the process. Additionally, downforce may be minimized to reduce defectivity.

20 Claims, 10 Drawing Sheets

SHORT CMP POLISH METHOD

BACKGROUND OF THE INVENTION

1. Field of the Invention

The present inventions pertain to semiconductor fabrication processing. More particularly, the present inventions relate to a system and method for reducing defects during short polishes of semiconductor wafers by raising the pH of the wafer surface in the presence of abrasives.

2. Description of the Prior Art

Currently semiconductor wafers are reworked on a regular basis. Wafers are reworked when the final thickness of the wafer after the polish is too thick to send on to the next step in the line. The causes of a wafer being underpolished are tool interruptions, incorrect process recipes, improper tool setup and bad consumables.

Wafer rework recipes are typically shortened wafer polishing product recipes. Rework recipes, like polish recipes, typically include two or more linear or rotary tables that do the planarizing and a third table that does a water buff on a softer pad.

Referring now to FIGS. 1 and 2, there is shown a block diagram of a CMP machine 100 including a rotary process table and a side partial perspective view of a wafer 105 (FIG. 2). The CMP machine 100 is fed wafers to be polished by an arm 101 and places them onto a rotating polishing pad 102. The polishing pad 102 is made of a resilient material and is textured, often with a plurality of predetermined grooves, to aid the polishing process. A conditioning arm 103 conditions the polishing pad. A wafer is held in place on the polishing pad 102 by the arm 101 with a predetermined amount of down force.

During polishing, the lower surface of the wafer 105 rests against the polishing pad 102. As the polishing pad 102 rotates, the arm 101 rotates the wafer 105 at a predetermined rate. The CMP machine 100 also includes a slurry dispense tube 107, extending across the radius of the polishing pad 102. The slurry dispense tube 107 dispenses a flow of slurry 106 onto the polishing pad 102 from the slurry source 112. Typically, the polishing pad 102 is primed with slurry 106 for about 8 seconds. The slurry 106 is a mixture of deionized water and polishing agents designed to aid chemically the smooth and predictable planarization of the wafer. The rotating action of both the polishing pad 102 and the wafer 105, in conjunction with the polishing action of the slurry, combine to planarize, or polish, the wafer 105 at some nominal rate. In current systems using silica slurry the pH of the slurry is very high, typically having a pH of around 10 or 11.

After the slurry dispense process is terminated, deionized water is dispensed from the deionized water source 110 via the water dispense tube 108 onto the pad. The wafer substrate is then rid of the slurry.

Referring now to FIG. 3, there is shown a block diagram of one example of a CMP process 200 which is typically used to rework wafers having a final thickness too thick to send on to the next step in the line. Input/output station mechanism 210 is used to load and unload the wafers and to transfer the wafer to polishing platen 220, where a high pH slurry polish is followed by an automatic rinse of deionized water, once the polish is complete. The wafer is then transferred to secondary polishing platen 230, where a second high pH slurry polish is again followed by a deionized water rinse, when the secondary polish is complete. The wafer is then transferred to a third, softer pad, where it is buffed with deionized water. The above three platens are included on the same multiple platen CMP machine 205. The processing that occurs on the platens defined by CMP machine 205 is referred to herein collectively as the "CMP polish processing".

The wafer 105 may then be then unloaded manually or may be unloaded using the input station mechanism 210. The wafer then undergoes post CMP cleaning. If desired, the wafer 105 may be transferred to brush stations 250 and/or 255 where the wafer is brushed with a scrub solution spray which, typically, has a high pH. Finally, the wafer 105 is transferred to the spin rinse and dry station 260, where the wafer is rinsed with deionized water and then dried. The processing that occurs at the brush stations and the drying station 260 is referred to herein collectively as the "post-CMP polish processing".

All particulate matter develops an electrically charged thin layer when suspended in a liquid solution. This charge is known as the zeta potential and can be either negative or positive. The zeta potential appears at the outer surface of the particle such that a small charge field surrounds the particle. Silica particles in a basic aqueous solution having a pH of about 10 or more results in a negative zeta potential on the silica particles. In addition, the zeta potential of any other particles present, as well as that of the surfaces contacted by the solution, is negative at such a high pH. The silica particles are thus electrostatically repelled from the semiconductor wafer facilitating the removal of the slurry residue from the wafer surface. When the pH at the surface of the wafer is lowered in the presence of silica particles, colloids form and silica agglomeration occurs on the surface of the wafer. As such, any time the pH of the wafer surface is lowered, a higher defectivity environment exists in the presence of microscopic particles. Defects generated include scratches on the wafer by slurry abrasive agglomerates and slurry abrasive (or any other particle) attaching to the wafer surface. If the pH of the liquid in contact with the wafer surface is not maintained at a high pH, the combination of downforce and abrasive particles will lead to high defects.

Three conditions are theoretically necessary to leave behind slurry residues, pits, and scratches on the wafer surfaces. First, there must be colloidal particles present on the wafer surface. These particles are the source of residual particles on the wafer surface, they are the same particles that can agglomerate and cause microscratches and oxide pit defects. Second, high downforce is necessary to overcome the energy barrier between a colloid (abrasive particle) and the wafer surface. Both electrical repulsion and Van der Waals attraction combine to create the net energy barrier between the wafer surface and the colloid. Third, in a silica based slurry system low pH reduces the electrical repulsion between the colloidal particles and makes the possibility of overcoming the energy barrier between the wafer surface and the colloidal particles more likely. Once the energy barrier is overcome, three types of destructive phenomenon can theoretically occur. First, colloidal particles begin to agglomerate. Second, colloidal particles and/or agglomerates of colloidal particles attach to the wafer surface. Third, larger agglomerates of colloidal particles scratch or pit the wafer surface, but do not adhere to the wafer surface.

Currently used short polish methods do not add defects when the polish time on each platen is greater then twenty seconds. However, when the planarization or oxide removal time on each platen decreases to less than about 15 seconds per platen, defects, especially slurry residues, become an issue. This minimum amount of total polish time forces a minimum film removal allowed for a short polish or rework. This minimum film removal is sometimes more than the final thickness specifications allow. The limitations of short polishes then, create a tradeoff between correct final wafer thickness and low post-CMP defectivity.

Referring now to FIG. 4, there is shown a first polishing platen 220 and a second polishing platen 230, such as those of FIG. 3. Once the slurry polish is completed on platen 220, the wafer 410 is kept wet with deionized water until the wafer 415 on platen 230 is finished being processed. Deionized water on platen 220 is carried on the surface of wafer 410 to platen 230. After the end-of-polish clean of wafer 415 is completed on platen 230, the platen 230 is primed with slurry, typically for about 8 seconds, to prepare for incoming wafer 410 from platen 220. Wafer 410 is placed on the pad. The net result is low pH at the start of the process and in the presence of abrasive. As discussed above, low pH at the wafer surface in the presence of abrasive causes agglomeration of particles, sticking of particles and agglomerates to the surface of the wafer and pitting and scratching of the wafer surface by large agglomerates. Additionally, surface uniformity is impacted. Referring now to FIG. 5, there is shown a graph of oxide removed vs. time on platen 2 and added defects vs. time on platen 2 for two platen 1 polish conditions. In the experiment used to generate FIG. 5, the two platen 1 polish conditions used were (1) the wafer dechucked on platen 1, but having no downforce on the wafer ("the first condition"); and (2) the wafer was polished normally for 5 seconds on platen 1 ("the second condition"). FIG. 5 was generated from data acquired from wafers polished for varying times on platen 2 for the above two conditions.

Lines 510 and 512 of FIG. 5 represent the added defects vs. time on platen 2 for the first condition and for the second condition, respectively. Lines 514 and 516 represent the oxide removed vs. time on platen 2 for the first condition and for the second condition, respectively. Note that for both platen 1 conditions, defects added to the wafer peaked between 6 and 9 seconds of platen 2 polish times. Also, the data shows that the wafers must be polished for at least 15 seconds to restore defects to an acceptable level. It is believed that the defects caused early on in the platen 2 polish cycle, as shown by lines 510 and 512 of FIG. 5, are the result of interaction between the processes of platens 1 and 2. The low pH at the surface of the wafer when first transferred from platen 1 to platen 2 makes the conditions ripe for and actually introduces defects, which must then be removed by longer time spent on platen 2.

What is needed is a method for providing a short polish of a wafer without the defectivity issues of current wafer rework methods. What is additionally needed is a process and system for raising the pH of the wafer surface to be short polished/reworked on platen 2 prior to polishing on platen 2.

These objects, and others, is satisfied by Applicant's present inventions disclosed herebelow.

SUMMARY OF THE INVENTION

The present inventions are directed towards a system and method of reworking a semiconductor wafer on a CMP machine ensuring for a short period of time, for example, less than 15 seconds, while improving defectivity. A high pH is maintained on the surface of the wafer when placed on a polishing pad. Additionally, in some embodiments downforce is optimized to further improve defectivity.

Related objects and advantages of the present invention will be apparent from the following description.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENTS

Figure 1:
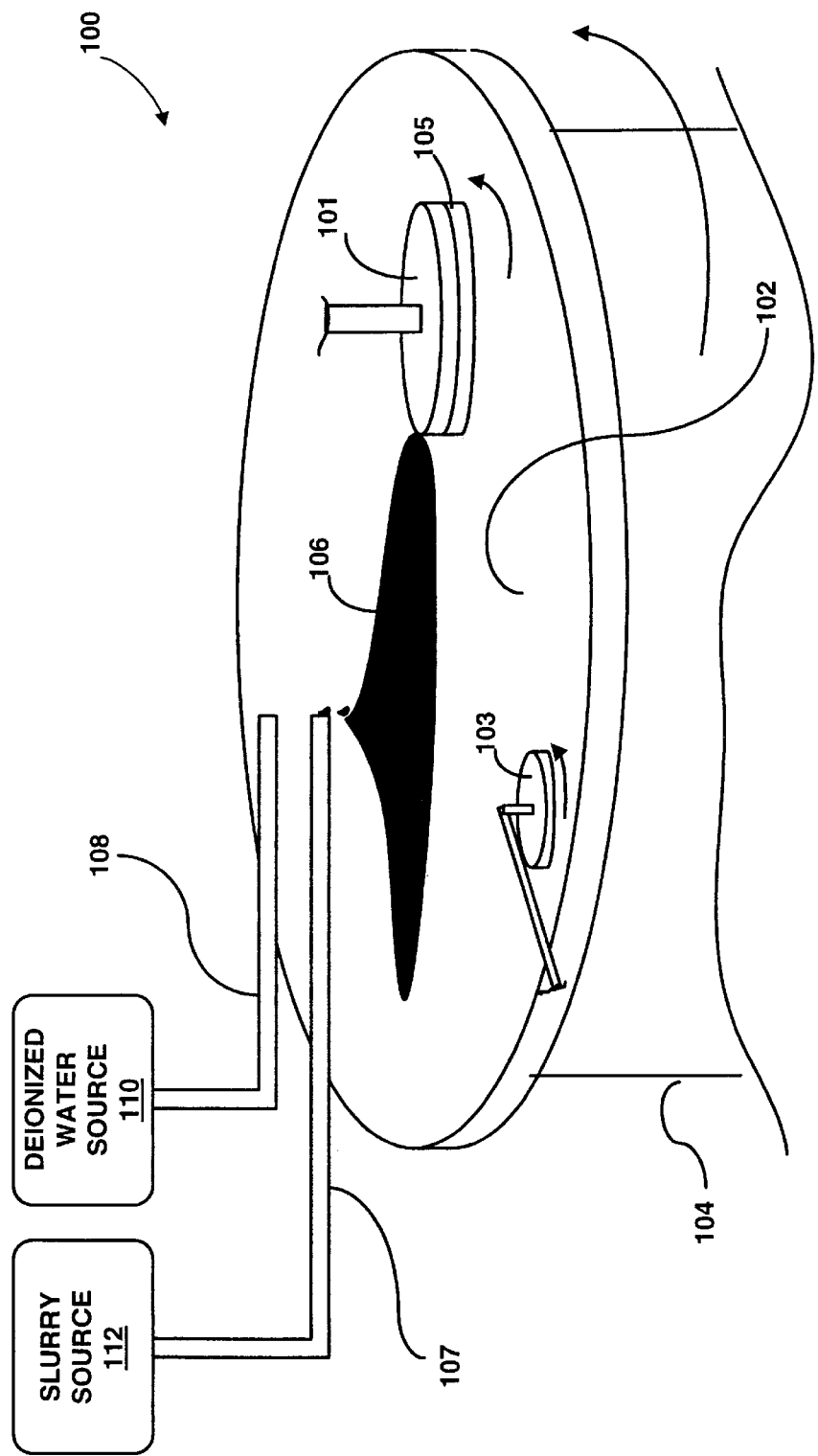
FIG. 1 is a block diagram of a prior art CMP machine.
Figure 2:
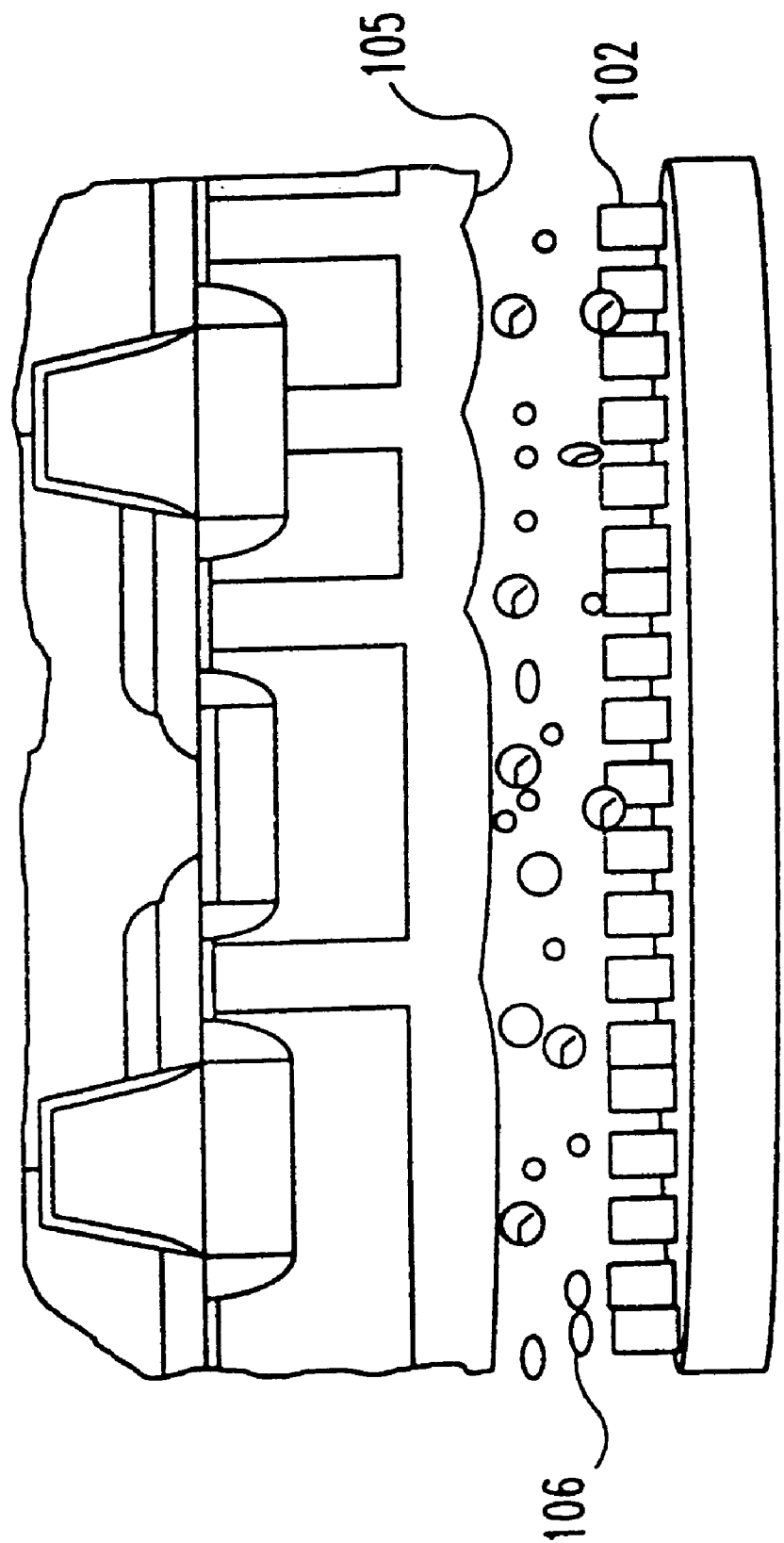
FIG. 2 is a side partial perspective view of a semiconductor wafer.

For the purposes of promoting an understanding of the principles of the inventions, reference will now be made to the embodiments illustrated in the drawings and specific language will be used to describe the same. It will nevertheless be understood that no limitation of the scope of the inventions is thereby intended, such alterations and further modifications of the principles of the inventions as illustrated therein being contemplated as would normally occur to one skilled in the art to which the inventions relate.

Figure 6:
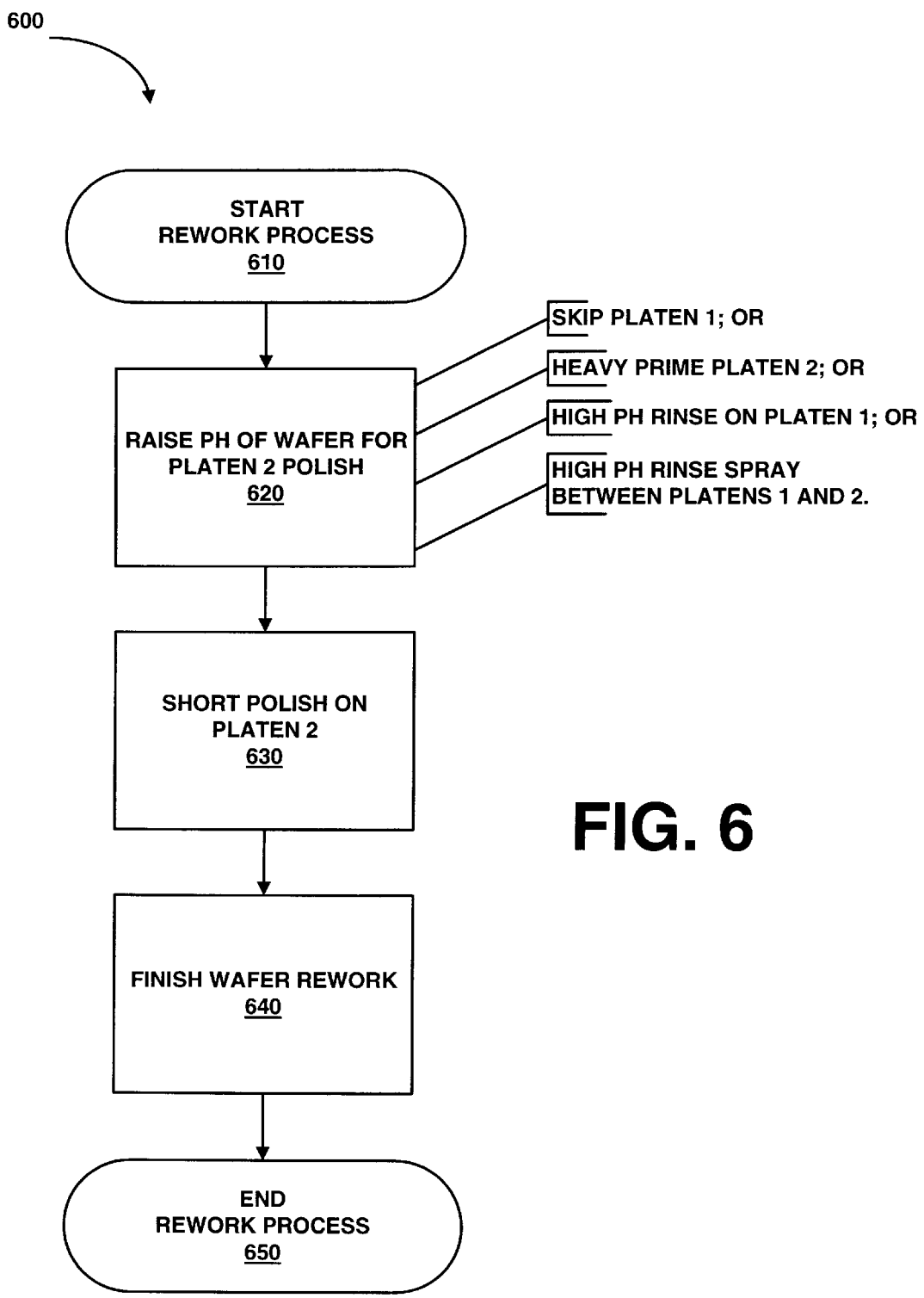
FIG. 6 is a flow chart of a CMP process in accordance with the present inventions.

Referring now to FIG. 6 there is shown a flow chart of a short polish or rework process 600 that alleviates high defectivity problems typically associated with short polish or rework processes. Based on zeta potential theory and empirical data, it has been determined that to alleviate high defectivity problems for short polishes there is a need to maintain a high pH on the wafer surface after it has been exposed to a high pH slurry. If the pH of the liquid in contact with the wafer is not maintained at a high pH, the combination of downforce and abrasive particles will lead to high defects. It has been found experimentally that a wafer having a downforce of 5 psi and undergoing a short polish cycle has a defect count almost 10 times higher than a similarly prepared wafer polished at 4 psi. Additionally, in the present inventions, the term high pH is used in connection with substances having a pH of about 10 and above. More preferably, the high pH materials described herein have a pH of between about 10 and 12. In one particular embodiment, the high pH materials have a pH of about 11.

Figure 3:
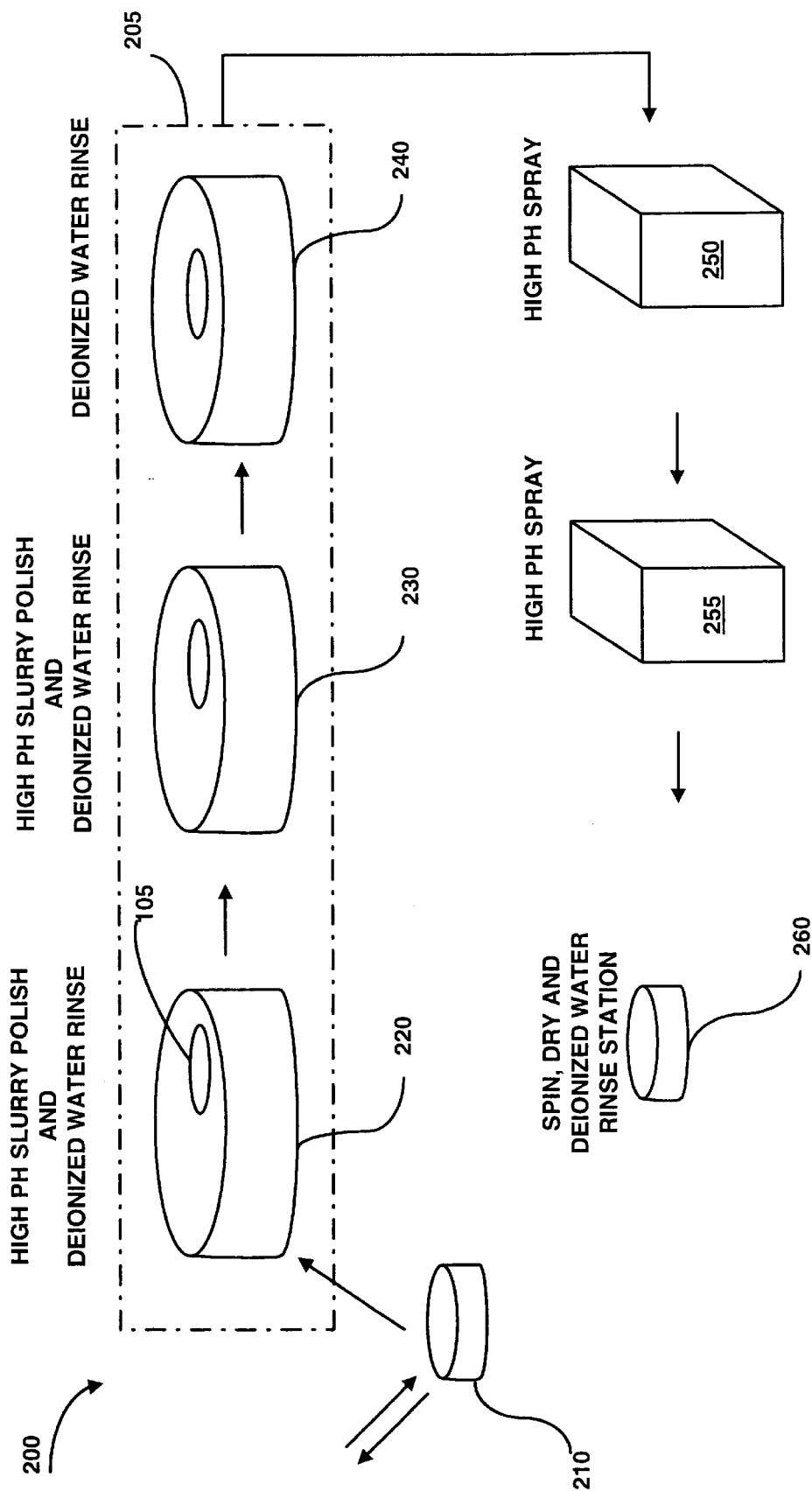
FIG. 3 is a block diagram of one example of a typical CMP rework process system.
Figure 4:
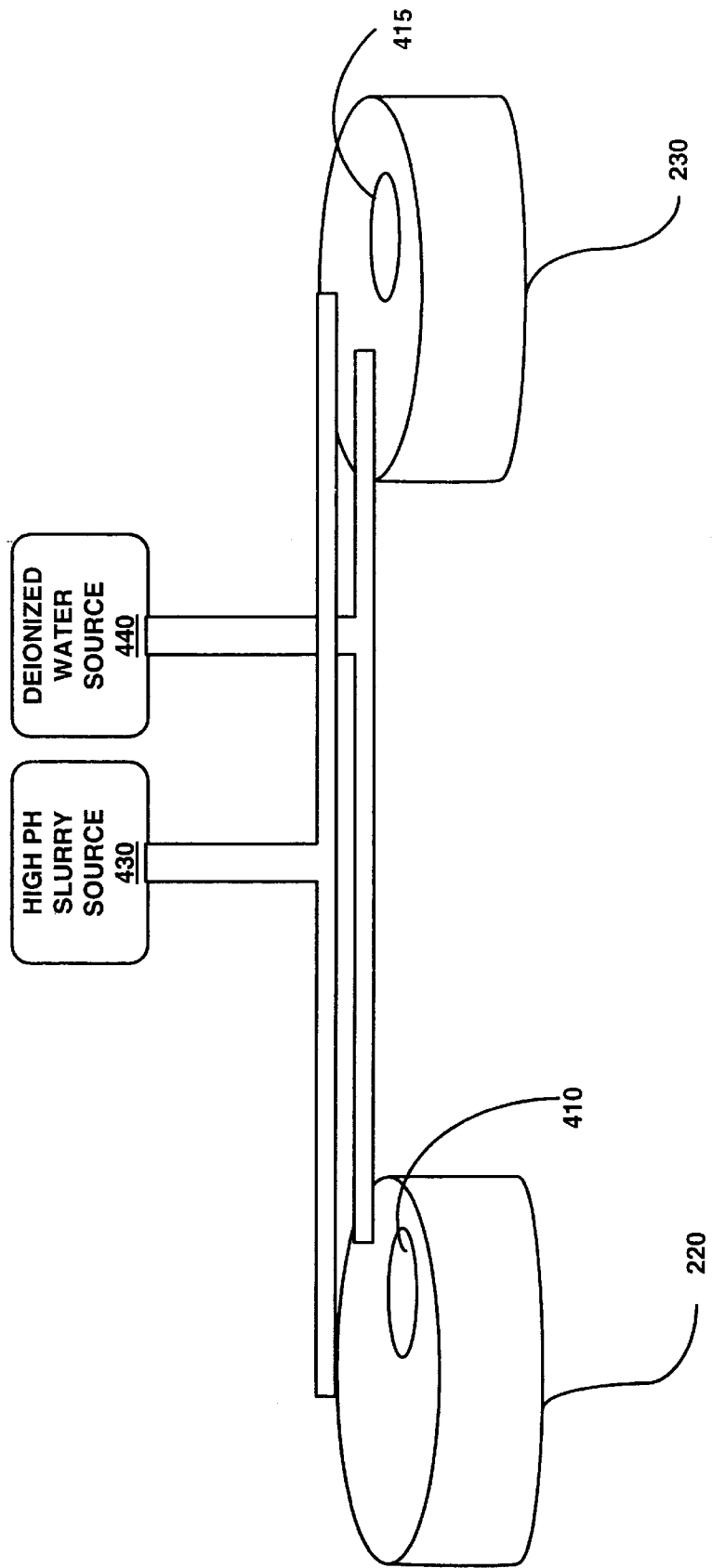
FIG. 4 is a block diagram of a portion of the CMP rework process system of FIG. 3.

Referring more specifically to FIG. 6, a wafer is introduced to a CMP machine for short polish or rework processing. Step 610. As noted above, ensuring a high pH on the surface of the wafer at platen 2 perhaps the most important thing for preventing additional defects from being introduced to the surface of the wafer during a short polish on platen 2. Step 620. Several embodiments for ensuring that the pH is high at the wafer surface on platen 2 will be described herein. Once the pH of the wafer surface is high, and the wafer surface is in contact with the polishing pad of platen 2, the wafer is polished on platen 2, for less than 15 seconds. Step 630. The wafer short polish or rework is then completed. Step 640. On a multi-platen CMP machine, such as is shown in FIG. 3, the wafer is rinsed and transferred to a third platen where it is buffed and than post-CMP processing (i.e. scrubbing, rinsing and/or drying) can occur. After which, the wafer short polish or rework is complete. Step 650. The slurry may be rinsed from the polishing platens using a high pressure rinse system, such as is disclosed in commonly assigned U.S. patent application Ser. No. 09/871,507.

Figure 7:
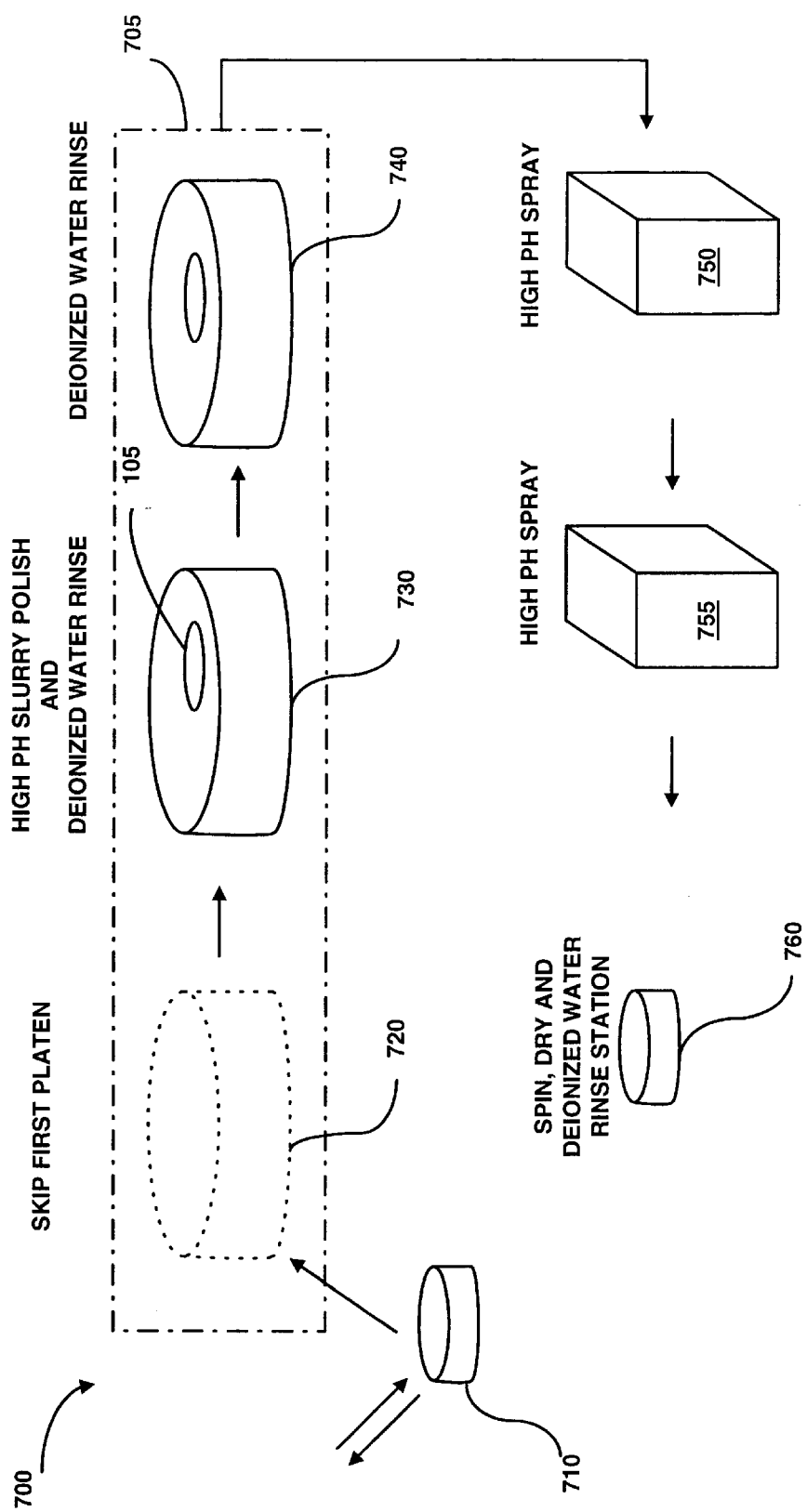
FIG. 7 is a block diagram of a CMP polish rework system in accordance with one embodiment of the present inventions.

Referring now to FIG. 7, there is shown one embodiment of the present inventions. The embodiment of FIG. 7 utilizes the principal of maintaining the pH high at the surface of the wafer prior to the short polish on a multi-platen machine 705, by skipping entirely in the rework process on one of the two polishing platens. In the present embodiment the first platen 720 is skipped. However, it can be seen that the first platen may be used and the second platen of the multi-platen machine skipped. This prevents exposure to slurry abrasives and lower pH that typically occurs when starting polish on the second platen 730 during the rework polish of the wafer. In this way, no pH lowering deionized water is transferred on the wafer surface to the second platen 730 from the first platen 720. In a full length polish system, this exposure to a lower pH is not normally a problem, since a typical polish process removes a large amount of oxide while on platen 730. However, short polishes do not remove much film and the slurry particles survive to the end of the process. Skipping the first platen in reworking the wafer 105 reduces the number of final defects in the wafer. This embodiment is particularly useful in processes where the total rework polish time of the wafer on the second platen is less than 30 seconds.

After the short polish on platen 730, the wafer 105 is rinsed with deionized water and transferred to platen 740, where it is buffed while being kept wet with deionized water. After buffing, post CMP polish processing occurs. Optionally, the wafer is scrubbed with high pH solution in brush scrubbers 750 and/or 755 and dried at the drying station 760.

Figure 5:
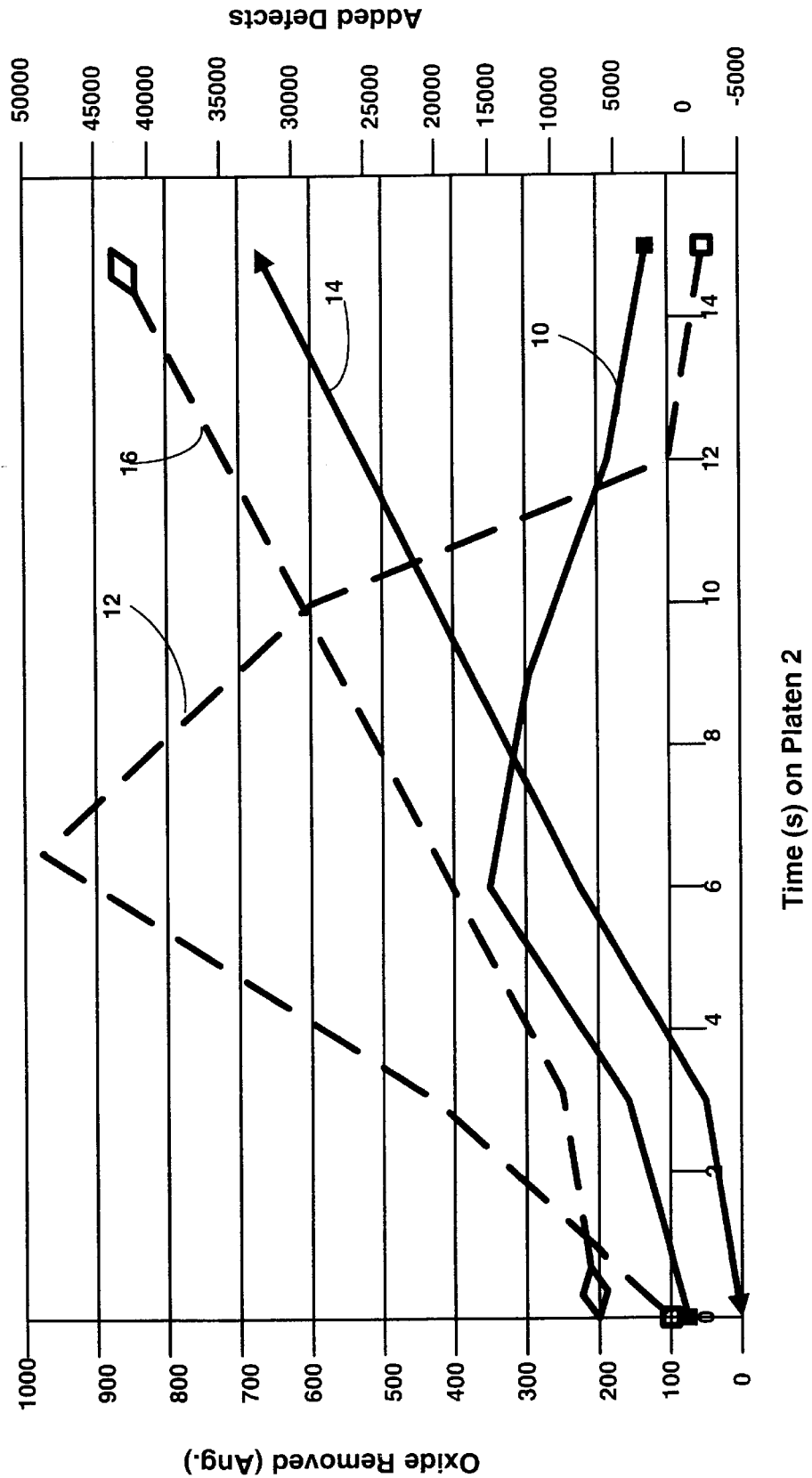
FIG. 5 a graph of oxide removed vs. time and of added defects vs. time for wafers being reworked on platen 2 of a system such as the system of FIG. 3 for two platen 1 polish conditions.
Figure 8:
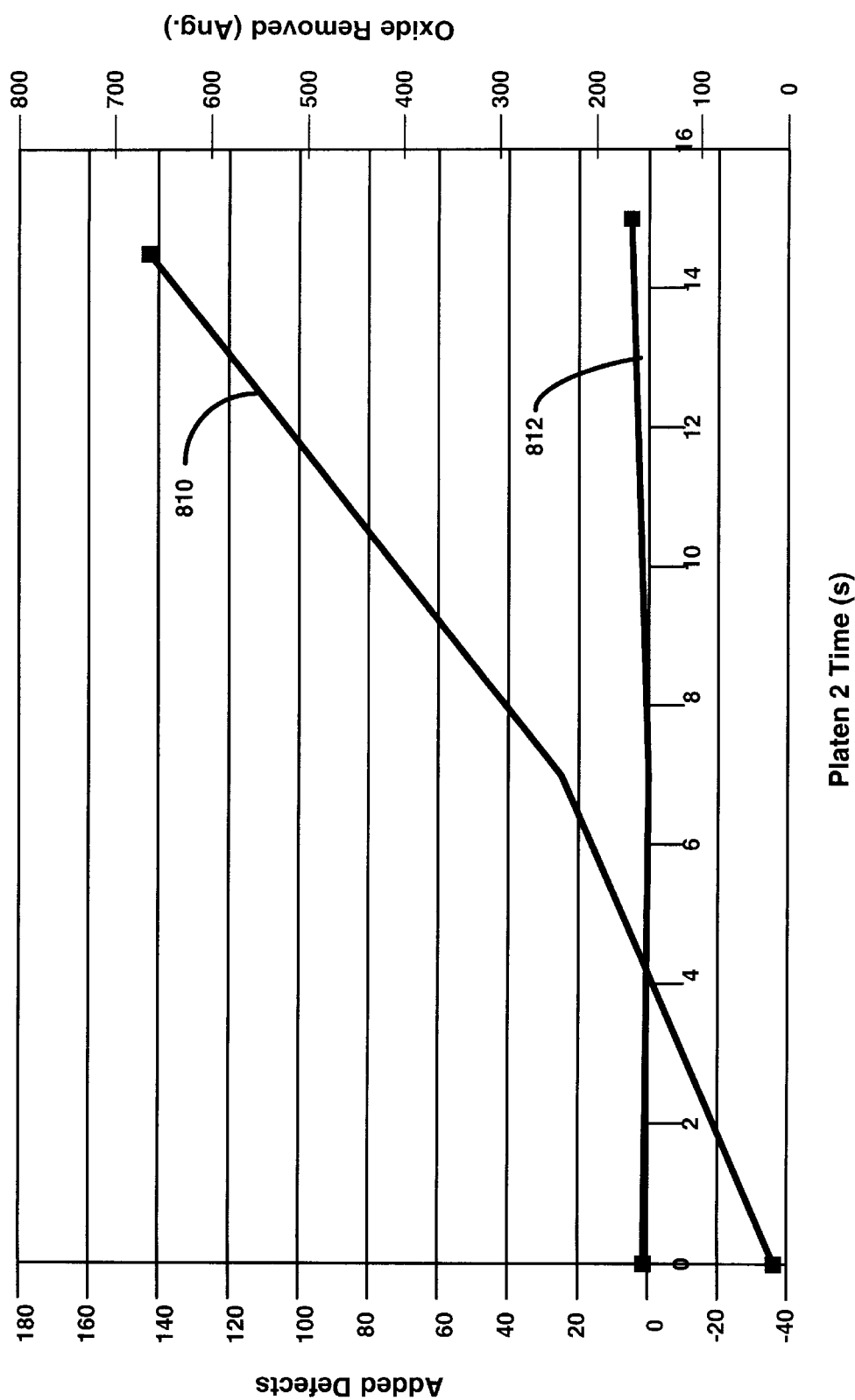
FIG. 8 is a graph of oxide removed vs. time and of added defects vs. time for wafers being reworked on platen 2 of a system in accordance with the embodiment of FIG. 7.

FIG. 8 is a graph of oxide removed vs. time and of added defects vs. time for wafers being reworked on the second platen of a multi-platen system in accordance with the embodiment of FIG. 7. More particularly, line 810 of FIG. 8 shows oxide removed vs. second platen time for a wafer that is placed on second platen and having skipped the first platen. Line 812 shows the added defects vs. time on the second platen for a wafer that has skipped the first platen. Note that the defect peak at 6 seconds seen in FIG. 5 is not repeated for wafers that skip the first platen and undergo oxide removal only on the second platen.

Figure 9:
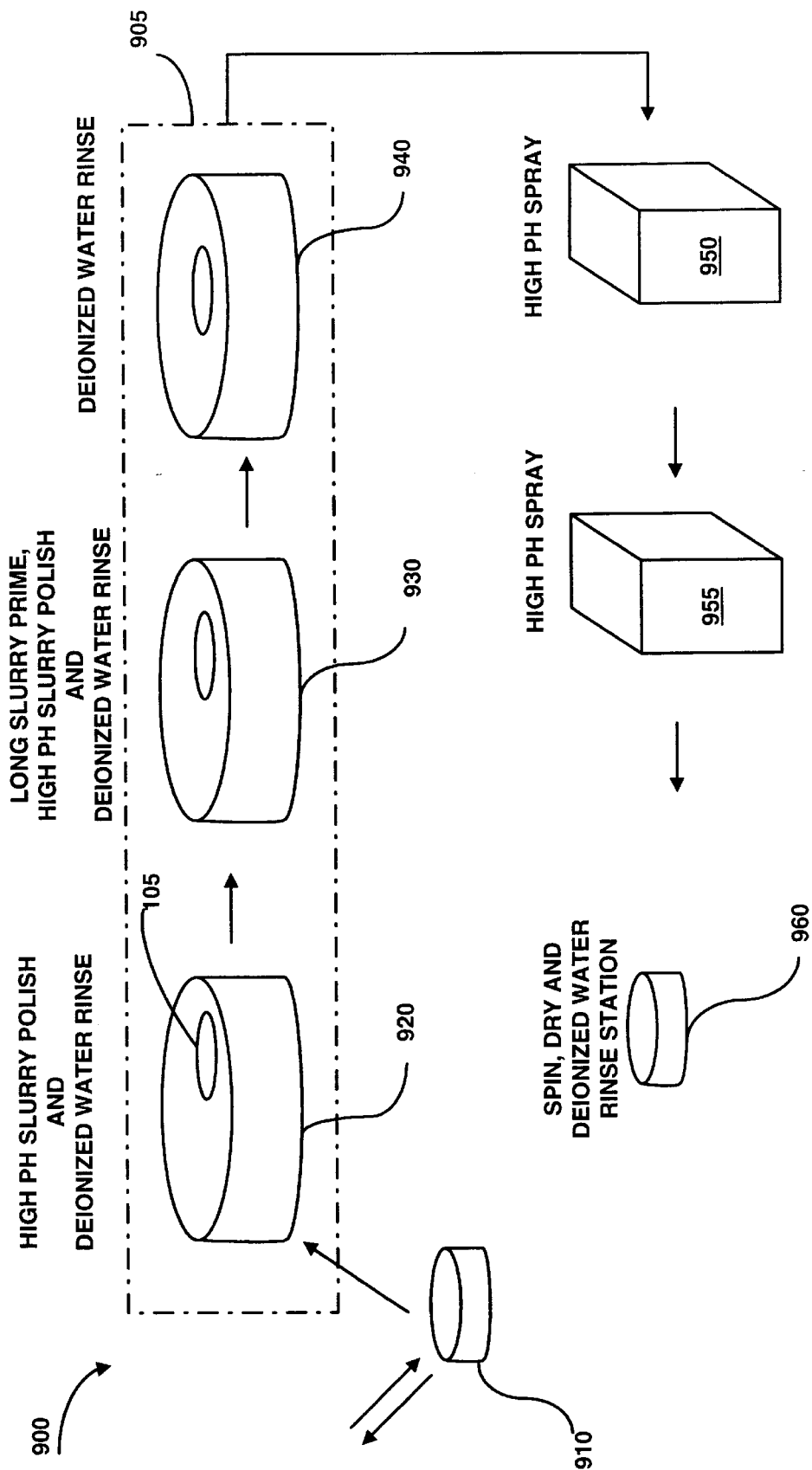
FIG. 9 is a block diagram of a CMP polish rework system in accordance with one embodiment of the present inventions.

Referring now to FIG. 9, there is shown a block diagram of another embodiment of the short polish system that alleviates high defectivity problems typically associated with short polish processes on a multi-platen CMP machine 905 in accordance with the present inventions. The embodiment of FIG. 9 achieves this result by priming the pad on platen 930 with large amounts of slurry prior to the wafer 105 being transferred from platen 920 for the purpose of raising the pH oat the surface of the wafer by displacing any deionized water carried over with the wafer from the carrier or prior platen.

For example, in one experiment the pad 930 was primed with slurry for 25 seconds prior to the wafer transfer from platen 920. This differs greatly from the standard slurry prime of around 8 seconds. In the present embodiment, it is preferred that the pad be primed with slurry prior to polishing for 9–30 seconds. More preferably, the pad is primed with slurry prior to polishing for 10–20 seconds. If cost were not an object, the polishing pad of the present embodiment would be preferably primed with slurry for 25 seconds prior to polishing the wafer surface. However to achieve an optimal balance between slurry cost and defectivity, a slurry prime in the range from 9–20 seconds may be chosen. It has been found that the extra second(s) of priming can be critical to reducing defectivity. Additionally, it has been found that by heavily priming the pad with slurry prior to polishing improves the removal uniformity on the surface of the wafer.

Priming the pad with large amounts of slurry maintains the high pH of the wafer surface at platen 930 by completely displacing the deionized water on the surface of the wafer 105 which is carried over after the rinse of platen 920. Once the pH is high at the wafer surface on the pad 930, the wafer is polished. In the present inventions, by raising the pH it has been found that defectivity is improved for short polishes of less than 15.

After the short polish on platen 930, the wafer 105 is rinsed with deionized water and transferred to platen 940, where it is buffed while being kept wet with deionized water. After buffing, post CMP polish processing occurs. If desired, the wafer is scrubbed with high pH solution in brush scrubbers 950 and/or 955 and dried at the drying station 960.

Figure 10:
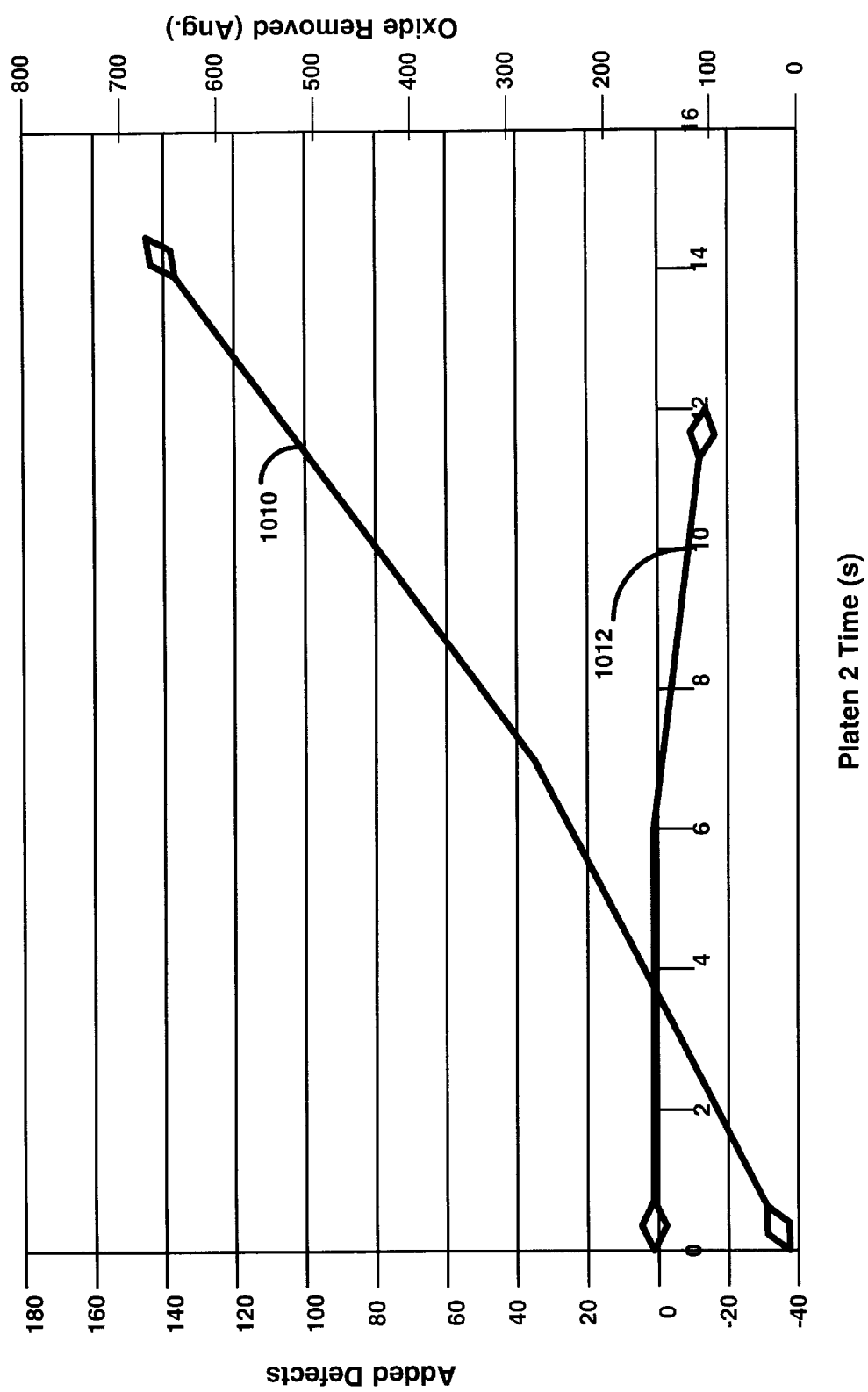
FIG. 10 is a graph of oxide removed vs. time and of added defects vs. time for wafers being reworked on platen 2 of a system in accordance with the embodiment of FIG. 9.

FIG. 10 is a graph of oxide removed vs. time and of added defects vs. time for wafers being reworked on the second platen of a system in accordance with the embodiment of FIG. 9. More particularly, line 1010 of FIG. 10 shows oxide removed vs. second platen time for a wafer that is placed on a heavily slurry primed second platen after transfer from a short polish on a first platen. Line 1012 shows the added defects vs. time on a second platen 2 for a wafer that has skipped the first platen. Note again that the defect peak at 6 seconds seen in FIG. 5 is not repeated for wafers processed in accordance with the present embodiment. Additionally, note that in FIG. 10 the removal rate of the film starts high immediately. This indicates that the pH is high at the beginning of the polish process.

Additionally, in the embodiments of FIGS. 7 and 9, it is desired that downforce at the second platen of the process be optimized to minimize defectivity, but still maintain other polish parameters to acceptable levels. As described above, it has been found that downforce has a dramatic impact on the final defectivity of the wafer. Defect counts were found to be almost 10 times higher for a wafer polished with only 1 psi of downforce higher. As such, in the preferred embodiments of the present inventions, it is desired that the downforce on the wafer be between 0 and 5 psi during the short polish. It is more preferred that the downforce on the wafer be between about 1 and 4 psi. It is most preferred that the downforce on the wafer at the second platen is chosen to be between 1 and 3 psi for the short CMP polish of the present.

While the inventions have been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed:

1. A method of reworking a surface of a semiconductor wafer on a CMP machine, comprising:
   providing the wafer to the CMP machine;
   placing the surface of the wafer in contact with a polishing pad;
   ensuring a high pH on the surface of the wafer when placed on a the polishing pad;
   polishing the surface of the wafer on said polishing pad with a high pH slurry for less than 15 seconds,
   rinsing the polishing pad after said polishing step while the wafer surface is still in contact with said pad.

2. The method of claim 1, wherein the CMP machine is a multi-platen CMP machine and said multi-platen CMP machine includes a first polishing pad and a second polishing pad and wherein said polishing step and said rinsing step occur on at least one of said first and second polishing pad.

3. The method of claim 2, wherein said ensuring step ensures said high pH by skipping one of said first and second polishing pad and polishing the wafer surface only on a remaining one of said first and second polishing pad.

4. The method of claim 3, wherein said first polishing pad is skipped and polishing only occurs on said second polishing pad.

5. The method of claim 4, wherein the wafer is held against said second polishing pad with a downforce of between about 1 and 4 psi during said polishing step.

6. The method of claim 2, wherein said ensuring step includes priming said second polishing pad for between 9 and 30 seconds with slurry before polishing the wafer surface.

7. The method of claim 6, wherein said ensuring step includes priming said second polishing pad for between about 10 and 20 seconds with slurry before polishing the wafer surface.

8. The method of claim 6, wherein said ensuring step includes priming said second polishing pad for 25 seconds with slurry before polishing the wafer surface.

9. The method of claim 8, wherein the wafer is held against said second polishing pad with a downforce of between about 1 and 4 psi during said polishing step.

10. A method of reworking a semiconductor wafer on a multi-platen CMP machine, comprising:
    (a) providing the wafer to a first polishing pad of the multi-platen CMP machine;
    (b) polishing the wafer on said first polishing pad with a high pH slurry;
    (c) placing the wafer in contact with a second polishing pad;
    (d) ensuring a high pH on the surface of the wafer when placed on the second polishing pad;
    (e) polishing the surface of the wafer on said second polishing pad with a high pH slurry for less than 15 seconds,
    (f) rinsing the polishing pad after step (e) while the wafer surface is still in contact with said pad.

11. The method of claim 10, wherein said ensuring step includes priming said second polishing pad for between 9 and 30 seconds with slurry before polishing the wafer surface.

12. The method of claim 11, wherein said ensuring step includes priming said second polishing pad for between about 10 and 20 seconds with slurry before polishing the wafer surface.

13. The method of claim 11, wherein said ensuring step includes priming said second polishing pad for 25 seconds with slurry before polishing the wafer surface.

14. The method of claim 12, wherein the wafer is held against said second polishing pad with a downforce of between about 1 and 4 psi during said polishing step.

15. The method of claim 12, wherein the wafer is held against said second polishing pad with a downforce of less than 3 psi during said polishing step.

16. A system for reworking a semiconductor wafer on a multi-platen CMP machine, comprising:
    a multi-platen CMP machine including:
        a first polishing pad;
        a second polishing pad;
        a high pH slurry source for providing slurry to said first and second polishing pads,;
        a rinse source for providing a rinse solution to said first and second polishing pads;
    a control mechanism connected to said high pH slurry source and operable to provide slurry to said second polishing pad for at between 9 and 30 seconds to prime said second polishing pad;
    a control system for polishing the wafer on said second polishing pad for less than 15 seconds.

17. The system of claim 16, wherein said control mechanism primes said second polishing pad for between 10 and 20 seconds with slurry before polishing the wafer surface.

18. The system of claim 16, wherein said control mechanism primes said second polishing pad for 25 seconds with slurry before polishing the wafer surface.

19. The system of claim 17, wherein the wafer is held against said second polishing pad with a downforce of between about 1 and 4 psi during said polishing step.

20. The system of claim 19, wherein the wafer is held against said second polishing pad with a downforce of less than 3 psi during said polishing step.

* * * * *